US008861298B2

United States Patent
Shibata

(10) Patent No.: US 8,861,298 B2
(45) Date of Patent: Oct. 14, 2014

(54) SEMICONDUCTOR STORAGE SYSTEM CAPABLE OF SUPPRESSING PEAK CURRENT

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 395 days.

(21) Appl. No.: 13/229,999

(22) Filed: Sep. 12, 2011

(65) Prior Publication Data

US 2012/0163112 A1 Jun. 28, 2012

(30) Foreign Application Priority Data

Dec. 27, 2010 (JP) ................................ 2010-291304

(51) Int. Cl.
G11C 5/14 (2006.01)
G11C 16/04 (2006.01)
G11C 16/30 (2006.01)
G11C 11/56 (2006.01)

(52) U.S. Cl.
CPC ............ G11C 5/147 (2013.01); G11C 16/0483 (2013.01); G11C 11/5642 (2013.01); G11C 16/30 (2013.01); G11C 11/5628 (2013.01); G11C 2216/14 (2013.01)
USPC .......................................................... 365/226

(58) Field of Classification Search
CPC ........ G11C 16/30; G11C 5/147; G11C 5/144; G11C 16/225
USPC ................................................ 365/226–229
See application file for complete search history.

(56) References Cited

U.S. PATENT DOCUMENTS

| 7,656,711 | B2 | 2/2010 | Shibata et al. | |
|---|---|---|---|---|
| 2002/0014637 | A1* | 2/2002 | Higuchi | ........................ 257/200 |
| 2002/0016690 | A1* | 2/2002 | Okamoto | ........................ 702/65 |
| 2008/0192548 | A1* | 8/2008 | Shibata et al. | ............ 365/185.17 |
| 2012/0206977 | A1* | 8/2012 | Shibata et al. | ............ 365/185.22 |

FOREIGN PATENT DOCUMENTS

| JP | 1-125800 A | 5/1989 |
|---|---|---|
| JP | 2-287845 | 11/1990 |
| JP | 5-288798 A | 11/1993 |
| JP | 5-326870 A | 12/1993 |
| JP | 10-228415 | 8/1998 |
| JP | 11-242632 A | 9/1999 |
| JP | 2000-82294 A | 3/2000 |
| JP | 2002-351737 A | 12/2002 |
| JP | 2008-197807 | 8/2008 |

OTHER PUBLICATIONS

Office Action issued Jul. 2, 2013 in Japanese Patent Application No. 2010-291304 with English language translation.

* cited by examiner

*Primary Examiner* — Vanthu Nguyen
*Assistant Examiner* — Khamdan Alrobaie
(74) *Attorney, Agent, or Firm* — Oblon, Spivak, McClelland, Maier & Neustadt, L.L.P.

(57) ABSTRACT

According to one embodiment, in a semiconductor storage system, the power supply wiring is connected to a first semiconductor storage device, and second semiconductor storage device as a common connection, and supplies power to the first and second semiconductor storage devices. A voltage detection circuit is provided in each of the first and second semiconductor storage devices. Each of the voltage detection circuits detects a power supply voltage of the power supply wiring. A control circuit is provided in each of the first and second semiconductor storage devices. When lowering of the power supply voltage is detected by a corresponding voltage detection circuit, each of the control circuits does not shift the operation of the first or second semiconductor storage device to the next operation until the power supply voltage is restored.

11 Claims, 16 Drawing Sheets

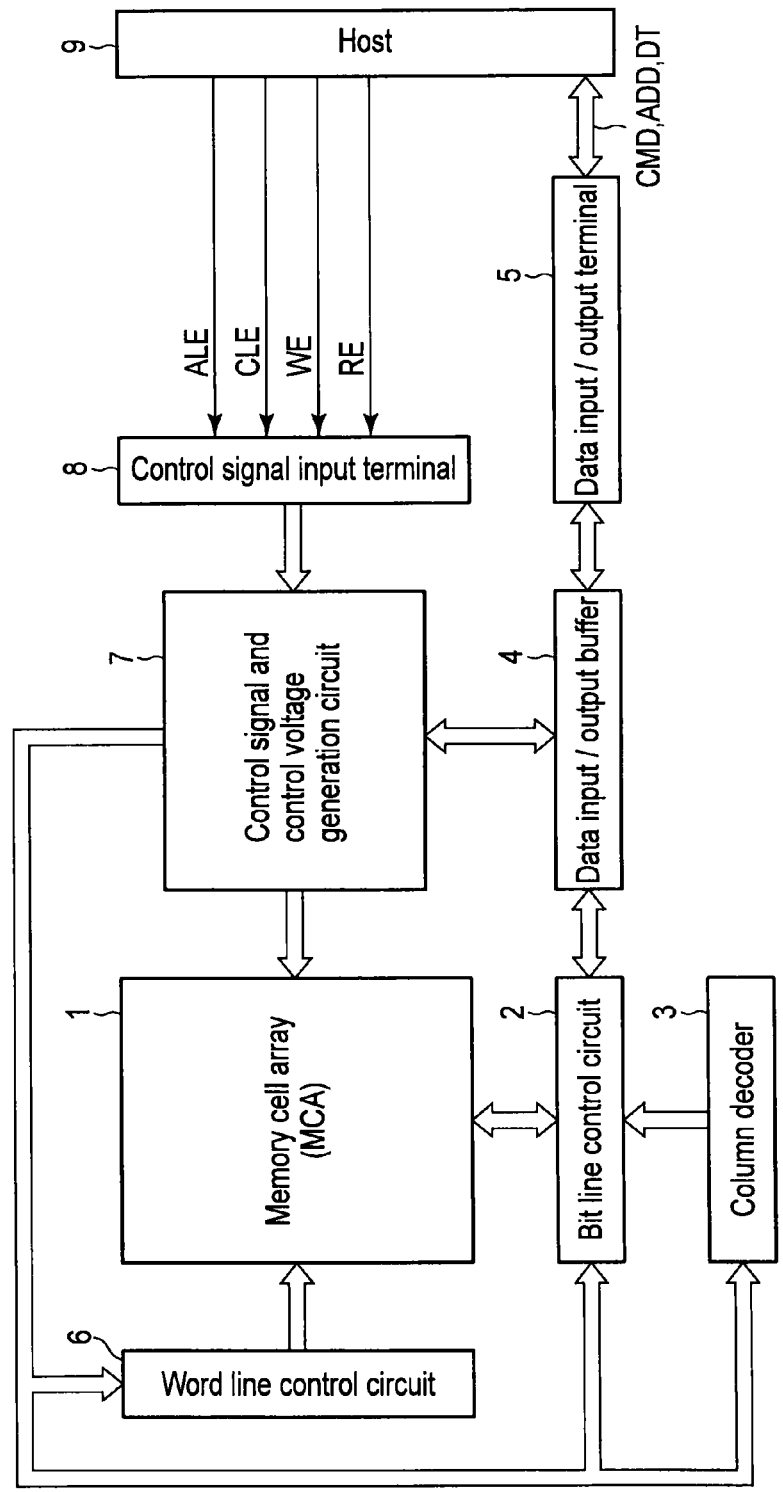
F I G. 1

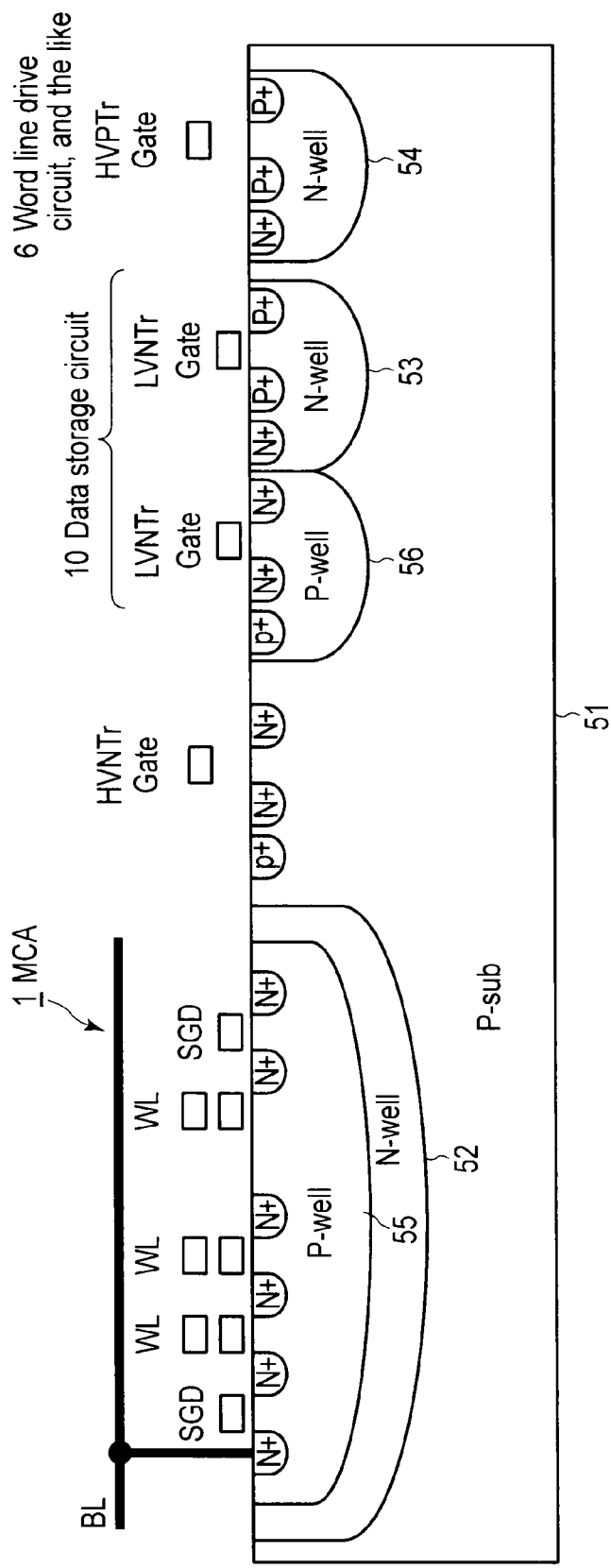
F I G. 5

|  | Cell (P-Well) | Cell (N-Well) | H.V.Tr (P-sub) | L.V.Nch (P-Well) | L.V.Pch (N-Well) | H.V.Pch (N-Well) |
| --- | --- | --- | --- | --- | --- | --- |
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V) / Vpgmh |
| Read | Vss(0V) | Vss(0V) | Vss(0V) | Vss(0V) | Vdd(2.5V) | Vdd(2.5V) / Vread |

F I G. 6

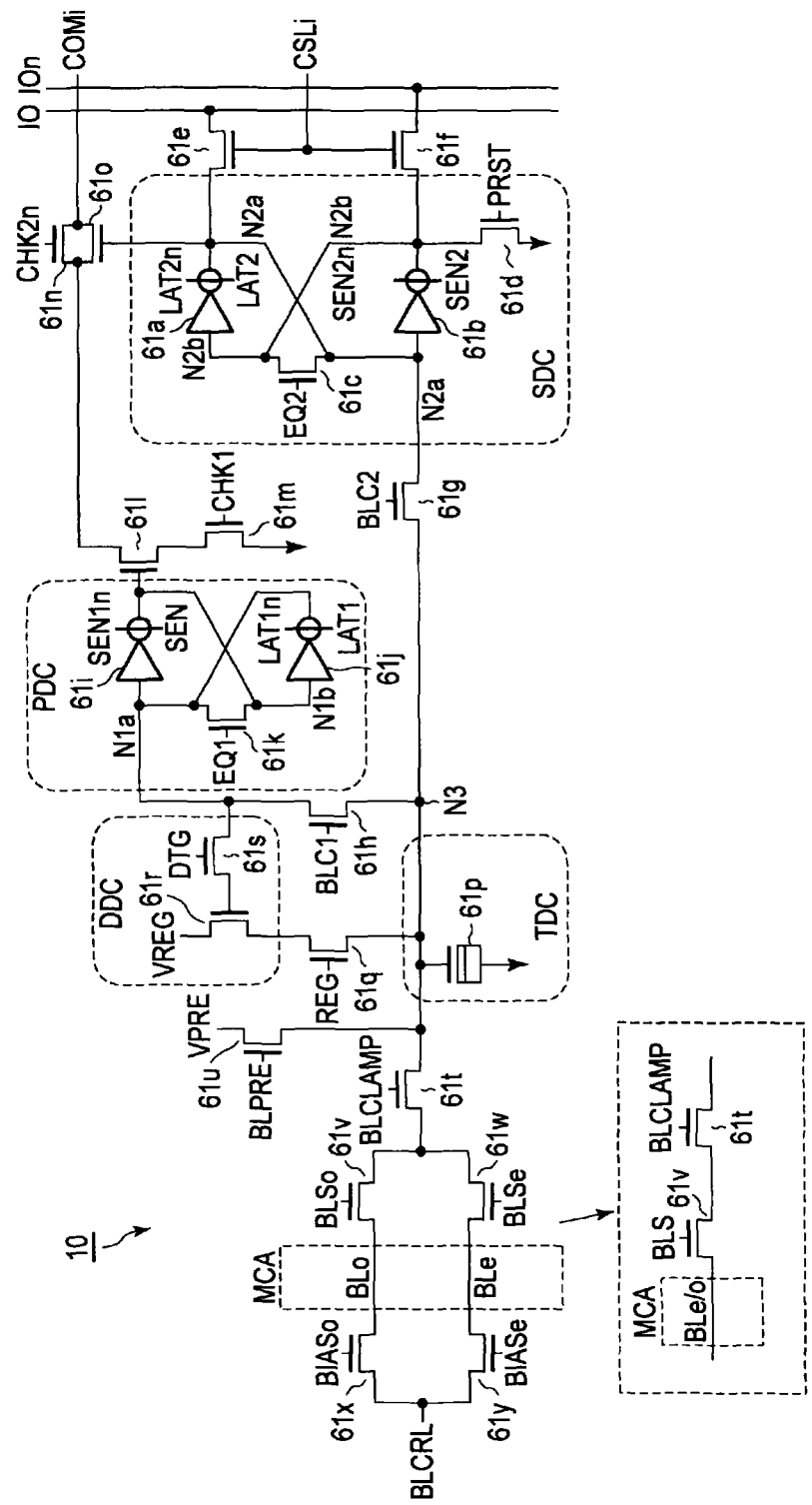
F I G. 7

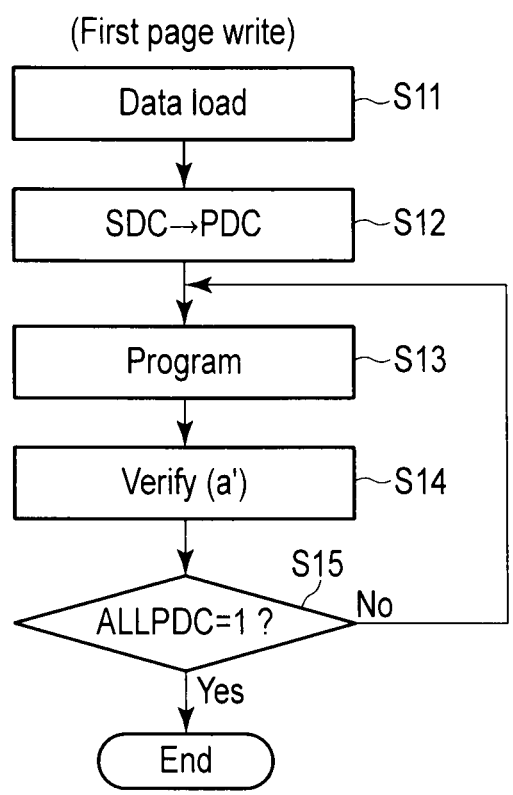
F I G. 11

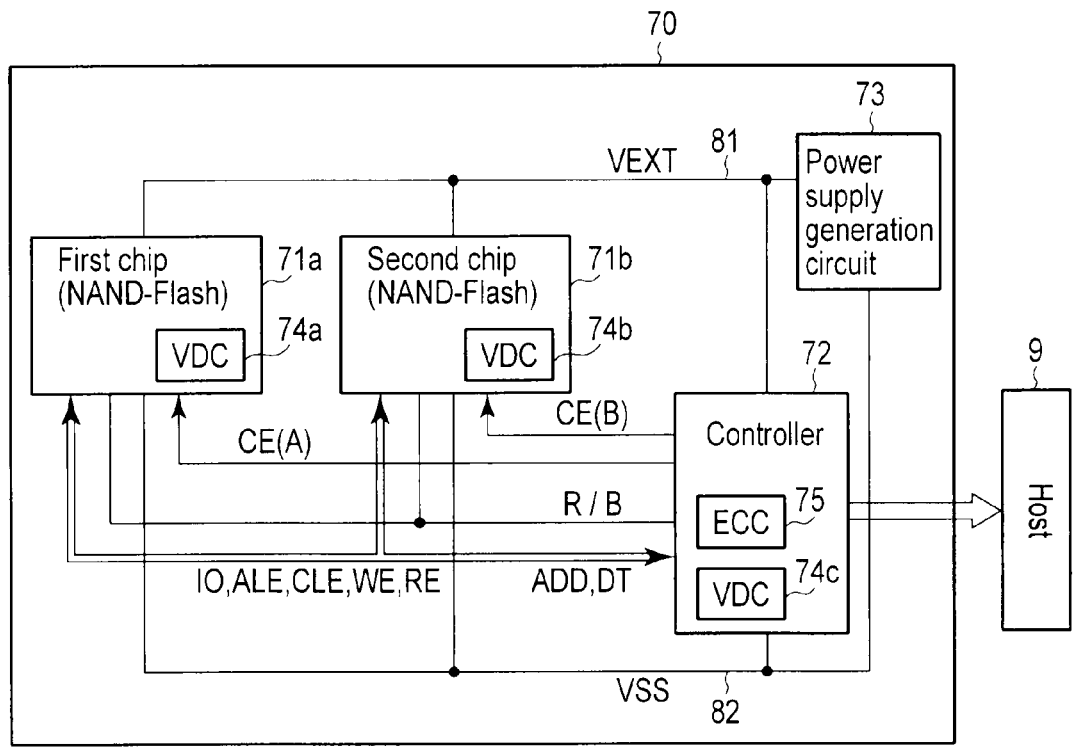
F I G. 1 3
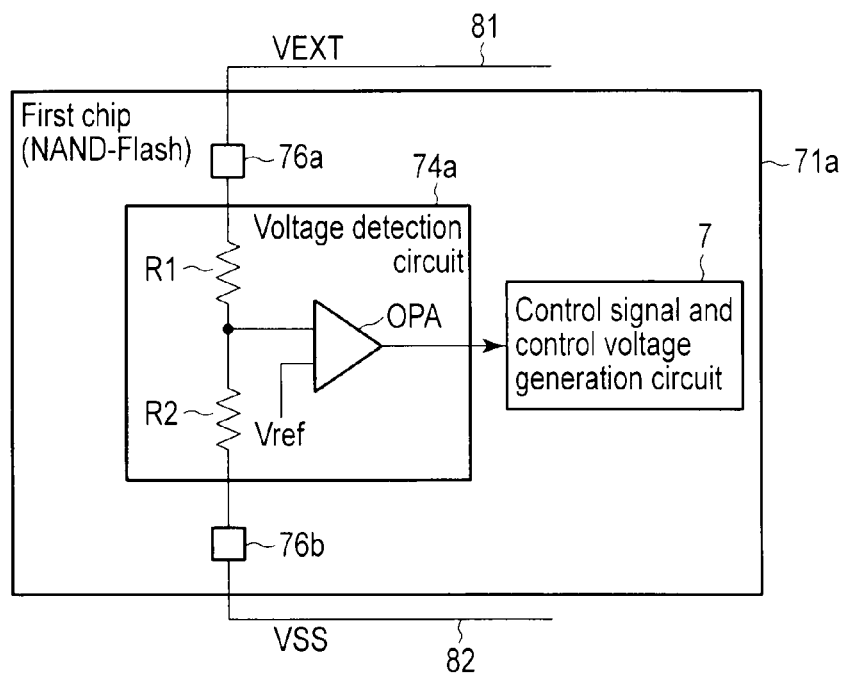
F I G. 1 4

SEMICONDUCTOR STORAGE SYSTEM CAPABLE OF SUPPRESSING PEAK CURRENT

CROSS-REFERENCE TO RELATED APPLICATIONS

This application is based upon and claims the benefit of priority from prior Japanese Patent Application No. 2010-291304, filed Dec. 27, 2010, the entire contents of which are incorporated herein by reference.

FIELD

Embodiments described herein relate generally to, for example, a nonvolatile semiconductor storage device such as a NAND flash memory and, more particularly, to a semiconductor storage system in which a plurality of flash memories are incorporated.

BACKGROUND

In a NAND flash memory, it is necessary, at the start time of a program operation, to charge all the bit lines and, at the start time of a verify operation too, it is necessary to charge all the bit lines, and determine currents flowing through all the bit lines. Accordingly, a very large current becomes necessary, and a large peak current occurs temporarily.

Furthermore, the NAND flash memory increases the storage capacity, and hence the NAND flash memory is used in many cases as a multichip package (MCP) in which a plurality of, for example, two to four chips are packaged at once or a memory card in which a plurality of chips are packaged. As described above, when a plurality of chips are packaged, if peak currents of the chips overlap each other, a further larger peak current occurs, and there is the possibility of a problem such as power discontinuity or the like that lowers the reliability occurring.

BRIEF DESCRIPTION OF THE DRAWINGS

FIG. 1 is a configuration view schematically showing an example of a NAND flash memory applied to this embodiment.

FIG. 5 is a cross-sectional view showing a NAND flash memory.

FIG. 6 is a view showing an example of voltages to be supplied to the regions shown in FIG. 5.

FIG. 7 is a circuit diagram showing an example of the data storage circuit shown in FIG. 2, and FIG. 3.

FIG. 11 is a flowchart showing a program operation of a first page.

FIG. 13 is a configuration view schematically showing an example of a semiconductor storage system according to a first embodiment.

FIG. 14 is a circuit diagram showing an example of a voltage detection circuit shown in FIG. 13.

DETAILED DESCRIPTION

Figure 2:
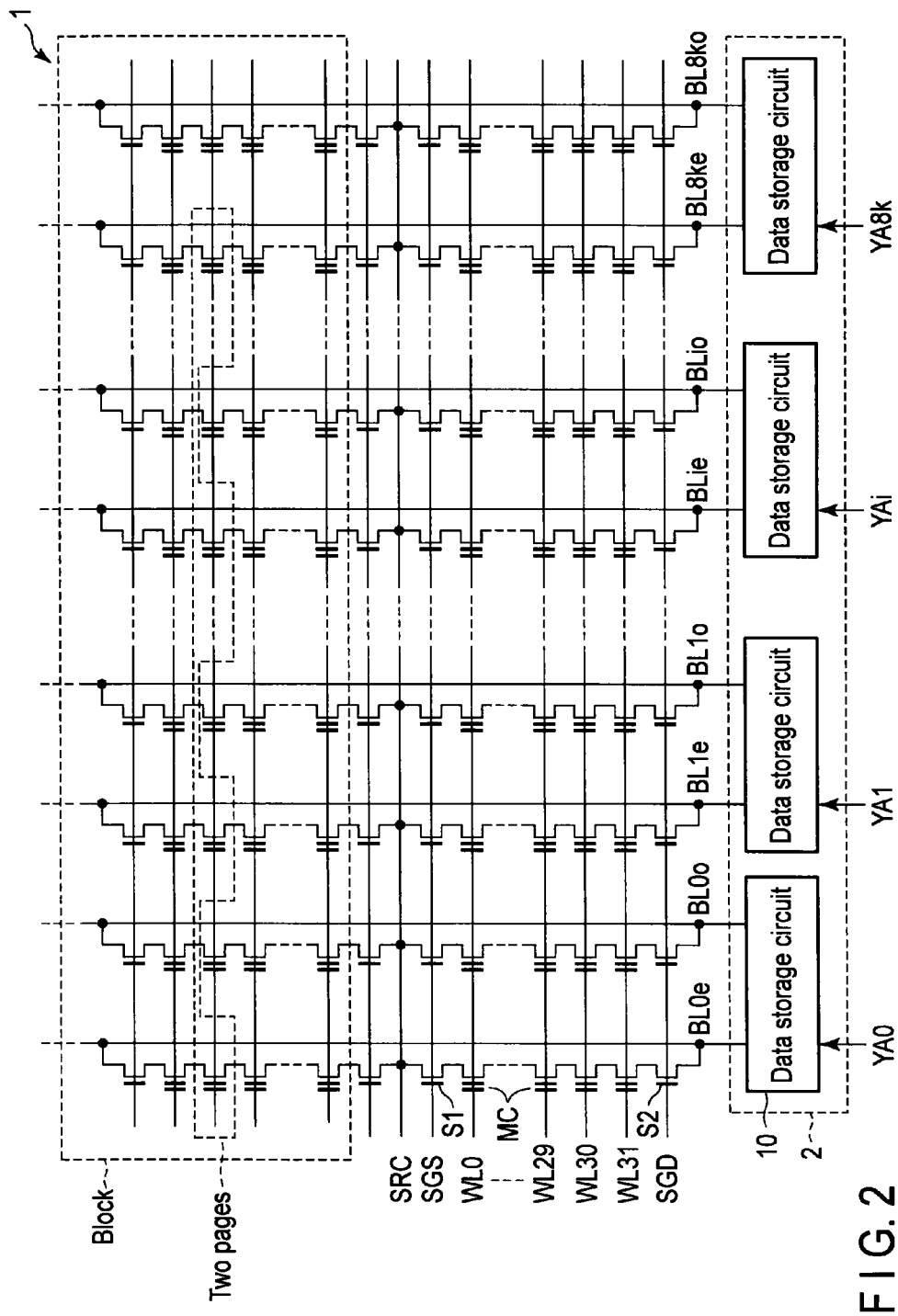
FIG. 2 is a circuit diagram schematically showing the configuration of part of FIG. 1.

In general, according to one embodiment, in a semiconductor storage system, the power supply wiring is connected to a first semiconductor storage device and second semiconductor storage device as a common connection, and supplies power to the first and second semiconductor storage devices. A voltage detection circuit is provided in each of the first and second semiconductor storage devices. Each of the voltage detection circuits detects a power supply voltage of the power supply wiring. A control circuit is provided in each of the first and second semiconductor storage devices. When lowering of the power supply voltage is detected by a corresponding voltage detection circuit, each of the control circuits does not shift the operation of the first or second semiconductor storage device to the next operation until the power supply voltage is restored.

Hereinafter, embodiments will be described below with reference to the drawings.

First, the configuration and operation of one NAND flash memory applied to this embodiment will be described by using FIGS. 1 to 12.

FIG. 1 shows the schematic configuration of a NAND flash memory configured to store therein, for example, 2-bit, 4-level data.

A memory cell array 1 includes a plurality of bit lines, a plurality of word lines, and common source line, and in which memory cells constituted of, for example, EEPROMs, and capable of electrically rewriting data are arranged in a matrix form. A bit line control circuit 2 configured to control bit lines, and word line control circuit 6 are connected to the memory cell array 1.

The bit line control circuit 2 reads data of a memory cell in the memory cell array 1 through a bit line, detects a state of a memory cell in the memory cell array 1 through a bit line, and writes data to a memory cell by applying a write control voltage to the memory cell in the memory cell array 1 through a bit line. A column decoder 3, and data input/output buffer 4 are connected to the bit line control circuit 2. A data storage circuit in the bit line control circuit 2 is selected by the column decoder 3. The data of the memory cell read into the data storage circuit is output to the outside from a data input/output terminal 5 through the data input/output buffer 4. Various commands CMD configured to control the operation of the NAND flash memory, addresses ADD, and data DT which are supplied from outside are input to the data input/output terminal 5. Write data input to the data input/output terminal 5 is supplied to the data storage circuit selected by the column decoder 3 through the data input/output buffer 4, and the commands and addresses are supplied to a control signal and control voltage generation circuit 7.

The word line control circuit 6 is connected to the memory cell array 1. The word line control circuit 6 selects a word line in the memory cell array 1, and applies a voltage necessary for write or erase to the selected word line.

The memory cell array 1, bit line control circuit 2, column decoder 3, data input/output buffer 4, and word line control circuit 6 are connected to the control signal and control voltage generation circuit 7, and are controlled by the control signal and control voltage generation circuit 7. The control signal and control voltage generation circuit 7 is connected to a control signal input terminal 8, and is controlled by control signals Address Latch Enable (ALE), Command Latch Enable (CLE), Write Enable (WE), and Read Enable (RE) which are input from outside (for example, a host 9) through the control signal input terminal 8.

The aforementioned bit line control circuit 2, column decoder 3, word line control circuit 6, and control signal and control voltage generation circuit 7 constitute a write circuit, and read circuit.

FIG. 2 shows an example of the configuration of the memory cell array 1, and bit line control circuit 2. A plurality of NAND cells are arranged in the memory cell array 1. One NAND cell is constituted of memory cells MC constituted of, for example, thirty-two series-connected EEPROMs, and selection gates S1 and S2. The selection gate S2 is connected to a bit line BL0e, and selection gate S1 is connected to a source line SRC. The control gates of the memory cell MC arranged in the rows are connected to the word lines WL0 to WL29, WL30, and WL31 as common connections. Further, the selection gate S2 is connected to a select line SGD as a common connection, and selection gate S1 is connected to a select line SGS as a common connection.

The bit line control circuit 2 includes a plurality of data storage circuits 10. A pair of bit lines (BL0e, BL0o), (BL1e, BL1o) . . . (BLie, BLio), and (BL8ke, BL8ko) is connected to each of the data storage circuits 10.

The memory cell array 1 includes a plurality of blocks as indicated by a broken line. Each block is constituted of a plurality of NAND cells, and data is erased, for example, in units of the blocks. Further, erase operations are simultaneously carried out with respect to two bit lines connected to the data storage circuit 10.

A plurality of memory cells arranged at every other bit line, and connected to one word line (memory cells surrounded by a broken line) constitute one sector. Data is written to each sector, and is read from each sector. That is, half the plurality of memory cells arranged in the row direction are connected to a corresponding bit line. Accordingly, a write operation or a read operation is executed for each half the plurality of memory cells arranged in the row direction.

At the time of a read operation, program verify operation or program operation, one of the two bit lines (BLie, BLio) connected to the data storage circuit 10 is selected in accordance with an address signal (YA0, YA1 . . . YAi . . . YA8k) supplied from outside. Furthermore, one word line is selected in accordance with the external address, and two pages indicated by the broken line are selected. Switching between the two pages is carried out by the address.

Figure 3:
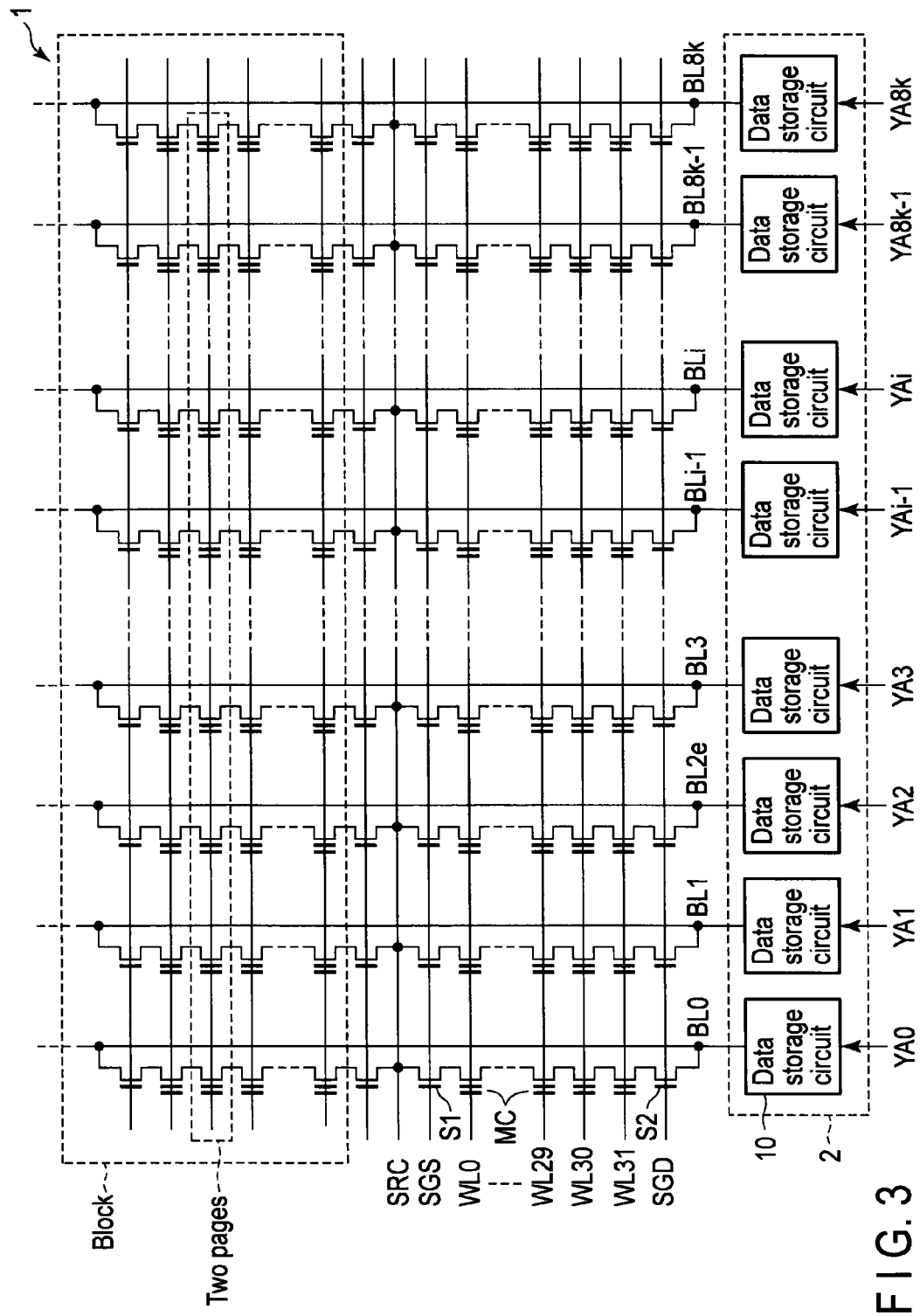
FIG. 3 schematically shows the configuration of part of FIG. 1, and is a circuit diagram showing an example different from FIG. 2.

FIG. 3 shows another example of the configuration of the memory cell array 1 and bit line control circuit 2 shown in FIG. 1. In the case of the configuration shown in FIG. 2, two bit lines (BLie, BLio) have been connected to the data storage circuit 10. Conversely, in the case of the configuration shown in FIG. 3, a data storage circuit 10 is connected to each bit line, and each of all the plurality of memory cells arranged in the row direction is connected to a corresponding bit line. Accordingly, it is possible to carry out a write operation or a read operation for all the memory cells arranged in the row direction.

It should be noted that although the following description can be applied to each of the configuration shown in FIG. 2, and configuration shown in FIG. 3, the case where FIG. 2 is used will be described below.

Figure 4A:
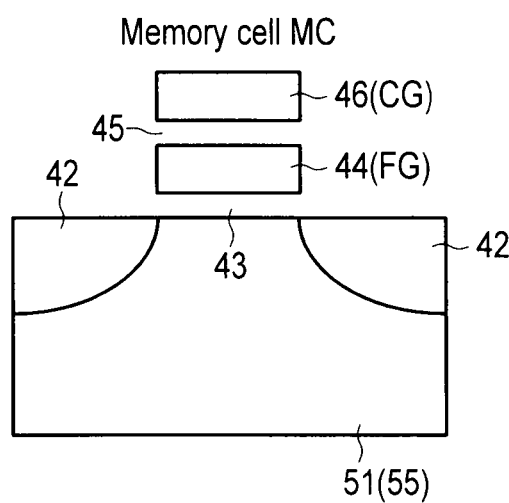
FIGS. 4A and 4B are cross-sectional views showing a memory cell, and selection gate, respectively.
Figure 4B:
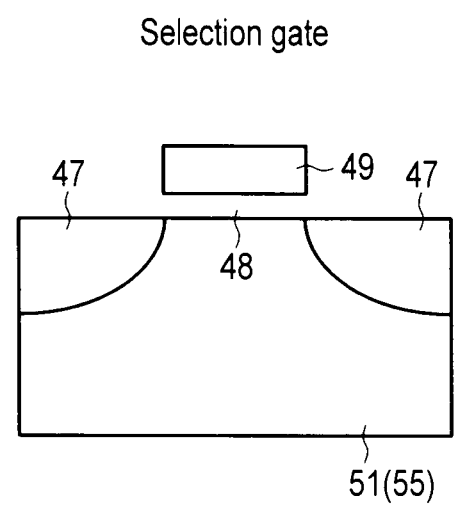

FIGS. 4A, and 4B show cross-sectional views of a memory cell, and selection transistor, respectively. FIG. 4A shows a memory cell. An n-type diffusion layer 42 serving as a source and drain of the memory cell is formed in a substrate 51 (P-type well region 55 to be described later). A floating gate (FG) 44 is formed on the P-type well region 55 through a gate insulating film 43, and a control gate (CG) 46 is formed on the floating gate 44 through an insulating film 45. FIG. 4B shows the selection gate. An n-type diffusion layer 47 serving as a source and drain is formed in the P-type well region 55. A control gate 49 is formed on the P-type well region 55 through a gate insulating film 48.

FIG. 5 shows a cross-sectional view of a NAND flash memory. N-type well regions 52, 53, and 54, and P-type well region 56 are formed in, for example, the P-type semiconductor substrate 51. A P-type well region 55 is formed in the N-type well region 52, and memory cell transistor Tr constituting the memory cell array 1 is formed in the P-type well region 55. Furthermore, a low voltage P-channel transistor LVPTr, and low voltage N-channel transistor LVNTr constituting the data storage circuit 10 are formed in the N-type well region 53, and P-type well region 56, respectively. A high voltage N-channel transistor HVNTr configured to connect a bit line and data storage circuit 10 to each other is formed in the substrate 51. Further, a high voltage P-channel transistor HVPTr constituting, for example, a word line drive circuit or the like is formed in the N-type well region 54. As shown in FIG. 5, the high voltage transistors HVNTr, and HVPTr each have, for example, a thick gate insulating film as compared with the low voltage transistors LVNTr, and LVPTr.

FIG. 6 shows an example of voltages to be supplied to the regions shown in FIG. 5. At the time of erase, program or read, a voltage shown in FIG. 6 is supplied to each region. Here, Vera is a voltage to be applied to the substrate at the time of data erase, Vss is a ground voltage, Vdd is a power supply voltage, Vpgmh is a voltage to be supplied to a gate of a transistor of a row decoder configured to transfer Vpgm to be supplied to a word line at the time of data write, and is a voltage greater than Vpgm+Vt (threshold voltage of the transfer transistor).

Vreadh is a voltage to be supplied to a gate of a transistor of a row decoder configured to transfer Vread to be supplied to a word line at the time of data read, and is a voltage greater than Vread+Vt (threshold voltage of the transfer transistor).

FIG. 7 is a circuit diagram showing an example of the data storage circuit 10 shown in FIG. 2.

This data storage circuit 10 includes a primary data cache (PDC), secondary data cache (SDC), dynamic data cache (DDC), and temporary data cache (TDC). Each of the SDC, PDC, and DDC holds input data at the time of write, holds read data at the time of read, temporarily holds data at the time of verify, and is used to operate internal data at the time of storing multi-level data. The TDC amplifies data of a bit line at the time of data read, temporarily holds the data, and is used to operate internal data at the time of storing multi-level data.

The SDC is constituted of clocked inverter circuits 61a and 61b constituting a latch circuit, and transistors 61c and 61d. The transistor 61c is connected between an input end of the clocked inverter circuit 61a, and input end of the clocked inverter circuit 61b. A signal EQ2 is supplied to a gate of the transistor 61*c*. The transistor 61*d* is connected between an output end of the clocked inverter circuit 61*b*, and the ground. A signal PRST is supplied to a gate of the transistor 61*d*. A node N2*a* of the SDC is connected to an input/output data line IO through a column selection transistor 61*e*, and node N2*b* thereof is connected to an input/output data line Ion through a column selection transistor 61*f*. A column selection signal CSLi is supplied to gates of these transistors 61*e* and 61*f*. The node N2*a* of the SDC is connected to a node N1*a* of the PDC through transistors 61*g*, and 61*h*. A signal BLC2 is supplied to a gate of the transistor 61*g*, and signal BLC1 is supplied to a gate of the transistor 61*h*.

The PDC is constituted of clocked inverter circuits 61I, and 61*j*, and transistor 61*k*. The transistor 61*k* is connected between an input end of the clocked inverter circuit 61I, and input end of the clocked inverter circuit 61*j*. A signal EQ1 is supplied to a gate of the transistor 61*k*. A node N1*b* of the PDC is connected to a gate of a transistor 61I. One end of a current path of the transistor 61I is grounded through a transistor 61*m*. A signal CHK1 is supplied to a gate of the transistor 61*m*. Further, the other end of the current path of the transistor 61I is connected to one end of a current path of transistors 61*n*, and 61*o* constituting a transfer gate. A signal CHK2*n* is supplied to a gate of the transistor 61*n*. Further, a gate of the transistor 61*o* is connected to an output end of the clocked inverter circuit 61*a*. A wiring COMi is connected to the other end of the current path of the transistors 61*n*, and 61*o*. The wiring COMi is a wiring common to all the data storage circuits 10 and, when verify of all the data storage circuits 10 is completed, the potential of the wiring COMi shifts to the high level. That is, as will be described later, when verify is completed, the node N1*b* of the PDC shifts to the low level. In this state, when the signals CHK1, and CHK2 are at the high level, if verify is already completed, the potential of the wiring COMi shifts to the high level.

Furthermore, the TDC is constituted of, for example, a MOS capacitor 61*p*. The capacitor 61*p* is connected between a connection node N3 of the transistors 61*g*, and 61*h*, and the ground. Further, the DDC is connected to the connection node N3 through a transistor 61*q*. A signal REG is supplied to a gate of the transistor 61*q*.

The DDC is constituted of transistors 61*r*, and 61*s*. A signal VREG is supplied to one end of a current path of the transistor 61*r*, and the other end thereof is connected to a current path of the transistor 61*q*. A gate of the transistor 61*r* is connected to the node N1*a* of the PDC through the transistor 61*s*. A signal DTG is supplied to a gate of the transistor 61*s*.

Furthermore, one end of a current path of transistors 61*t*, and 61*u* is connected to the connection node N3. A signal VPRE is supplied to the other end of the current path of the transistor 61*u*, and a signal BLPRE is supplied to a gate of the transistor 61*u*. A signal BLCLAMP is supplied to a gate of the transistor 61*t*. The other end of the current path of the transistor 61*t* is connected to one end of a bit line BLo through a transistor 61*v*, and is connected to one end of a bit line BLe through a transistor 61*w*. The other end of the bit line BLo is connected to one end of a current path of a transistor 61*x*. A signal BIASo is supplied to a gate of the transistor 61*x*. The other end of the bit line BLe is connected to one end of a current path of a transistor 61*y*. A signal BIASe is supplied to a gate of the transistor 61*y*. A signal BLCRL is supplied to the other end of a current path of the transistors 61*x*, and 61*y*. The transistors 61*x*, and 61*y* are turned on complementarily to the transistors 61*v*, and 61*w*, respectively, in accordance with the signals BIASo, and BIASe, respectively, and supply the potential of the signal BLCRL to an unselected bit line.

The signals and voltages described above are generated by the control signal and control voltage generation circuit 7 shown in FIG. 1, and the following operations are controlled on the basis of the control of the control signal and control voltage generation circuit 7.

Further, the configuration of the data storage circuit 10 shown in FIG. 3 is identical to the configuration shown in FIG. 7, and is different therefrom only in the connection to the bit line. That is, as shown in FIG. 7, for example, only the transistor 61*v* is connected to the other end of the transistor 61*t*, and the bit line BLe or BLo is connected thereto through the transistor 61*v*.

This memory is a multi-level memory, and can store 2-bit data in one cell. Switching between the two bits is carried out by the address (first page, and second page). When two bits are stored in one cell, two pages are used. When three bits are stored in one cell, switching between the three bits are carried out by the address (first page, second page, and third page). Furthermore, when four bits are stored in one cell, switching between the four bits is carried out by the address (first page, second page, third page, and fourth page).

Figure 8A:
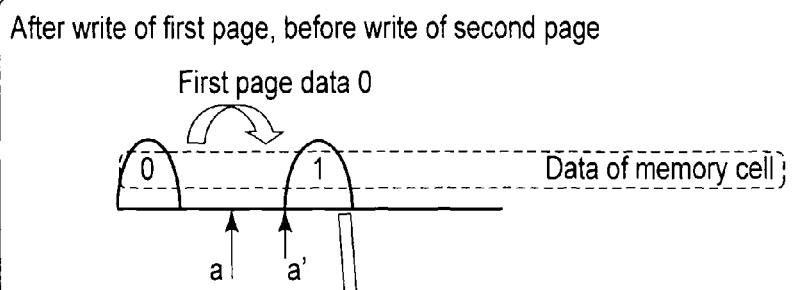
FIGS. 8A, 8B, and 8C are views showing a relationship between the data and threshold voltage of a case where 2-bit data is to be stored in the memory cell.
Figure 8B:
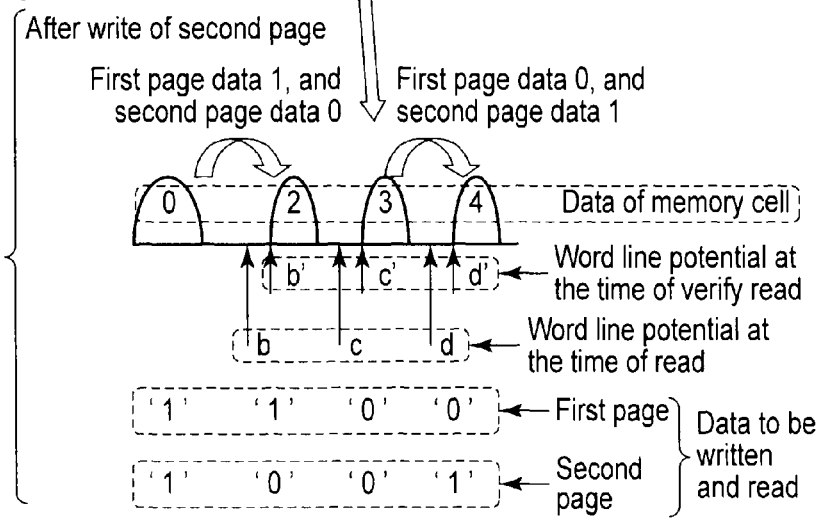
Figure 8C:
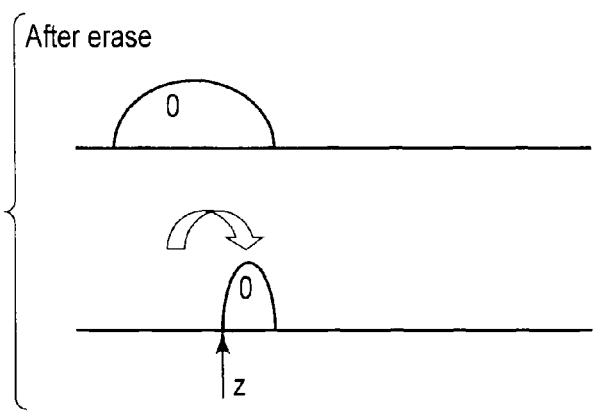

FIGS. 8A, 8B, and 8C show the relationship between the data and threshold in the case where 2-bit data is stored in the memory cell. When an erase operation is carried out, the data in the memory cell becomes "0" as shown in FIG. 8C. After the erase, in order to narrow the spread of threshold distribution, write is carried out by using, for example, the potential "z" at the time of verify read. The data "0" is set to, for example, a negative threshold voltage distribution.

As shown in FIG. 8A, in the write of the first page, when the write data is "1", the data of the memory cell is "0" as it is, and when the write data is "0", data of the memory cell becomes "1".

As shown in FIG. 8B, after write of the second page, the data of the memory cell becomes one of "0", "2", "3", and "4" in accordance with the write data. That is, when the data of the memory cell after the write of the first page is "0", and write data of the second page is "1", the data of the memory cell is "0" as it is, and when the write data of the second page is "0", the data of the memory cell becomes "2". Further, when the data of the memory cell after the write of the first page is "1", and write data is "0", the data of the memory cell becomes "3" and, when write data is "1", the data of the memory cell becomes "4". In this embodiment, the data of the memory cell is defined in such a manner that the data is arranged in ascending order of the threshold voltage.

(Read Operation)

As shown in FIG. 8A, after the write of the first page, the data of the memory cell exists in data "0" or "1", and hence the read operation is carried out by the potential "a" at the time of the read. Further, after the write of the second page, the data of the memory cell exists in one of "0", "2", "3", and "4" as shown in FIG. 8B. Accordingly, the read operation is carried out by one of the potentials at the time of the read "b", "c", and "d".

Figure 9:
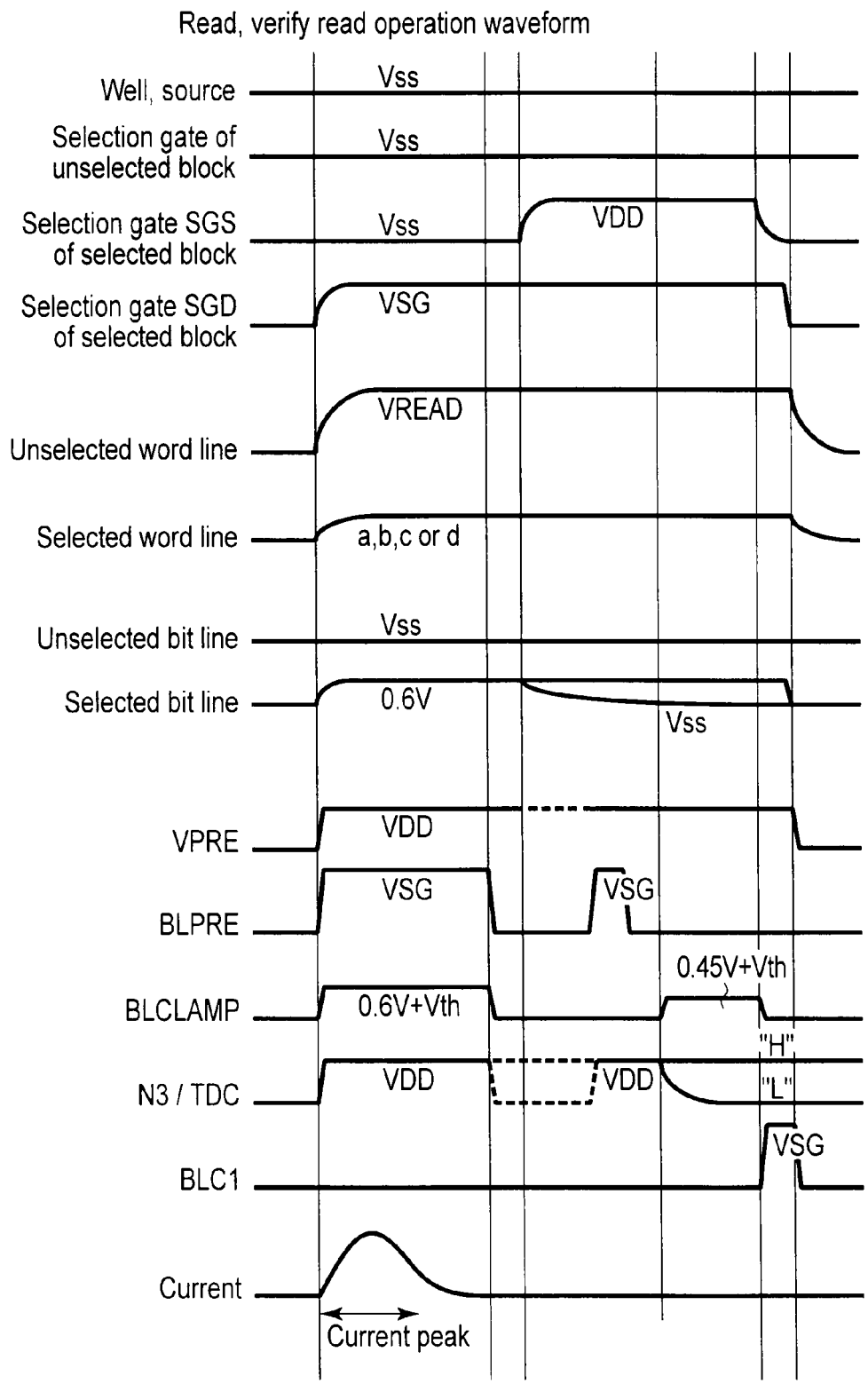
FIG. 9 is a waveform chart showing a read, verify read operation.

FIG. 9 shows waveforms of the read, verify read operation. In the read operation, first, the well, source line, and unselected bit line of the selected cell are set to 0V.

The potential at the time of the read "a" (for example "a"=0V), "b", "c" or "d" is supplied to the selected word line. Simultaneously with this, Vread is set on the unselected word line of the selected block, Vsg (=Vdd+Vth) is set on the select line SGD of the selected block, and select line SGS is set to Vss. The voltage of Vdd (for example, 2.5 V) is temporarily supplied to the signal VPRE of the data storage circuit shown in FIG. 7, voltage of Vsg is temporarily supplied to the signal BLPRE, voltage of, for example, (0.6 V+Vth) is temporarily supplied to the signal BLCLAMP, and the bit line is precharged to, for example, 0.6 V. Here, Vth is the threshold voltage of the transistor 61*u* shown in FIG. 7.

When the bit line is precharged, the voltage of the selected bit line is 0.6 V, and the voltage of the unselected bit line is Vss. Accordingly, assuming that the capacitance of a certain selected bit line, unselected bit line, well, source, and the like is 4 pF, the capacitance Q of one bit line is expressed by Q=C×V, and Q=4 pF×0.6 V. Here, when, for example, data of 8 kB is written at a time, Q is expressed by Q=8×1024×8×4 pF×0.6V. Accordingly, as shown in FIG. 9, a large peak current of the current (hereinafter referred to as a "consumption current" in some cases) flowing through the NAND flash memory occurs.

Subsequently, the select line SGS of the source side of the cell is set to Vsg (=Vdd+Vth). When the threshold voltage is higher than "a", "b", "c" or "d", the cell is turned off, and hence the bit line remains at the high level (for example, 0.6 V) as it is, and when the threshold voltage is lower than "a", "b", "c" or "d", the cell is turned on, and hence the bit line is discharged, and voltage of the bit line is brought to equal to voltage of the source, i.e., Vss.

Subsequently, the signal BLPRE of the data storage circuit shown in FIG. 7 is temporarily set to Vsg (=Vdd+Vth), and the node of the TDC is precharged to Vdd. After this, a voltage of, for example, (0.45 V+Vth) is supplied to the signal BLCLAMP. When the voltage of the bit line is lower than 0.45 V, the voltage of the node of the TDC shifts to the low level and, when the voltage of the bit line is higher than 0.45 V, the voltage of the node remains at the high level. Here, the signal BLC1 is set to Vsg (=Vdd+Vth), and the potential of the TDC is read into the PDC. Accordingly, when the threshold voltage of the cell is lower than the level of "a", "b", "c" or "d", the voltage of the PDC is brought to the low level and, when the threshold voltage is higher than the level of "a", "b", "c" or "d", the voltage of the PDC is brought to the high level, and read is carried out.

As shown in FIG. 3, when all the cells arranged in the row direction are collectively read, the select line SGS of the selected block is brought to the high level simultaneously with the select line SGD of the selected block. Accordingly, when the bit line is charged, the cell is, at the same time, in the on-state, the bit line is discharged and, when the cell is in the off-state, the bit line is held in the charged state. The level of the bit line is read into the PDC through the TDC. Accordingly, when the number of cells in the on-state is large, a large current flows from the node to which the signal VPRE is supplied into the source line, and a state where the potential of the source line is raised (the potential of the source line is floated). In order to prevent the state from occurring, regarding a cell which is first turned on when the read operation is carried out a plurality of times, i.e., the cell through which a current flows even when the potential of the source line is floated, a result of the read is made the low level. And the bit line is not charged the next time and thereafter, and regarding the cell for which the high level is read in the read of the first time, read is carried out again. Accordingly, in the read of the first time, a large peak current occurs.

(Program and Program Verify)
(Program)

Figure 10:
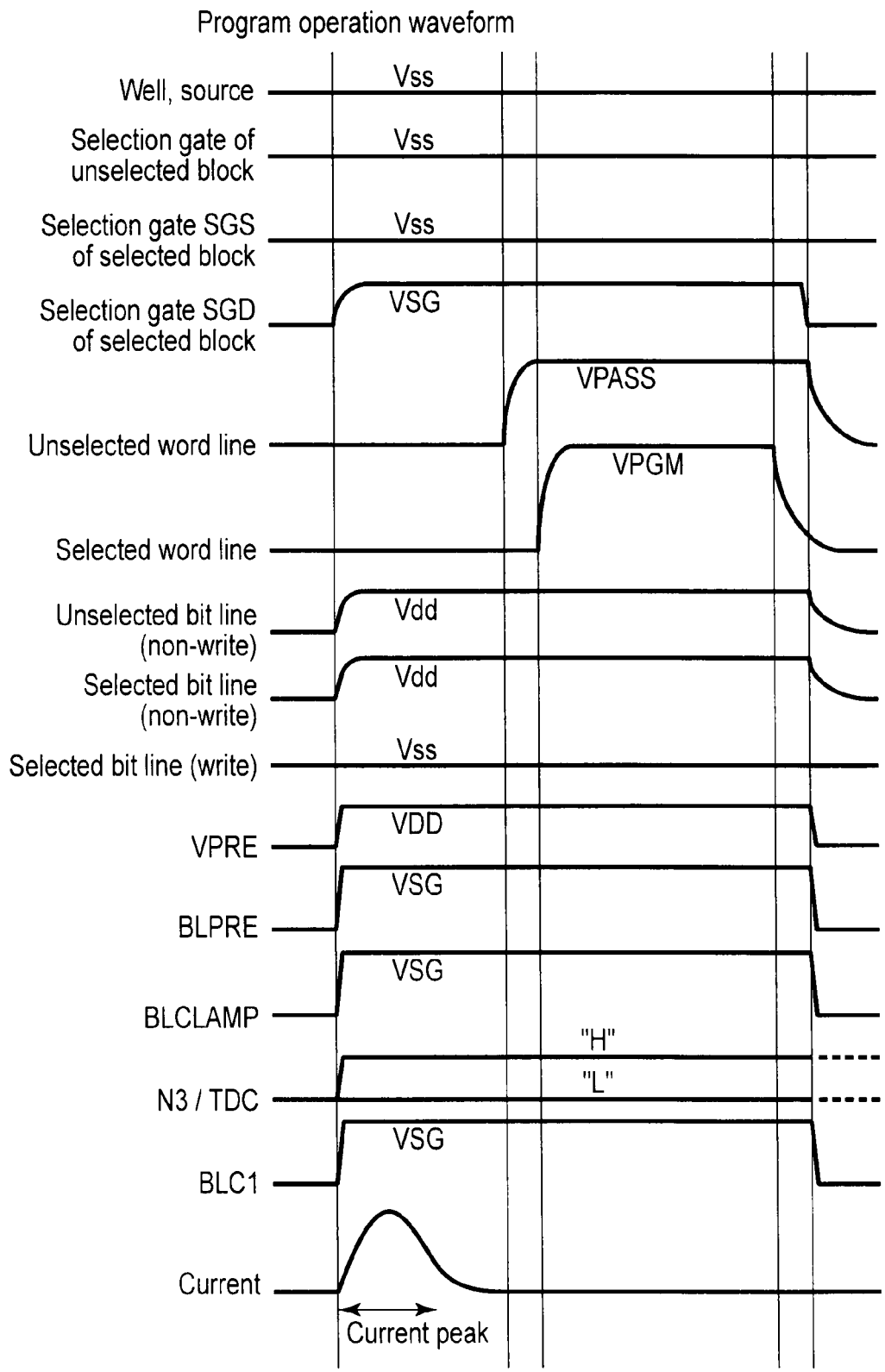
FIG. 10 is a waveform chart showing a program operation.
Figure 12:
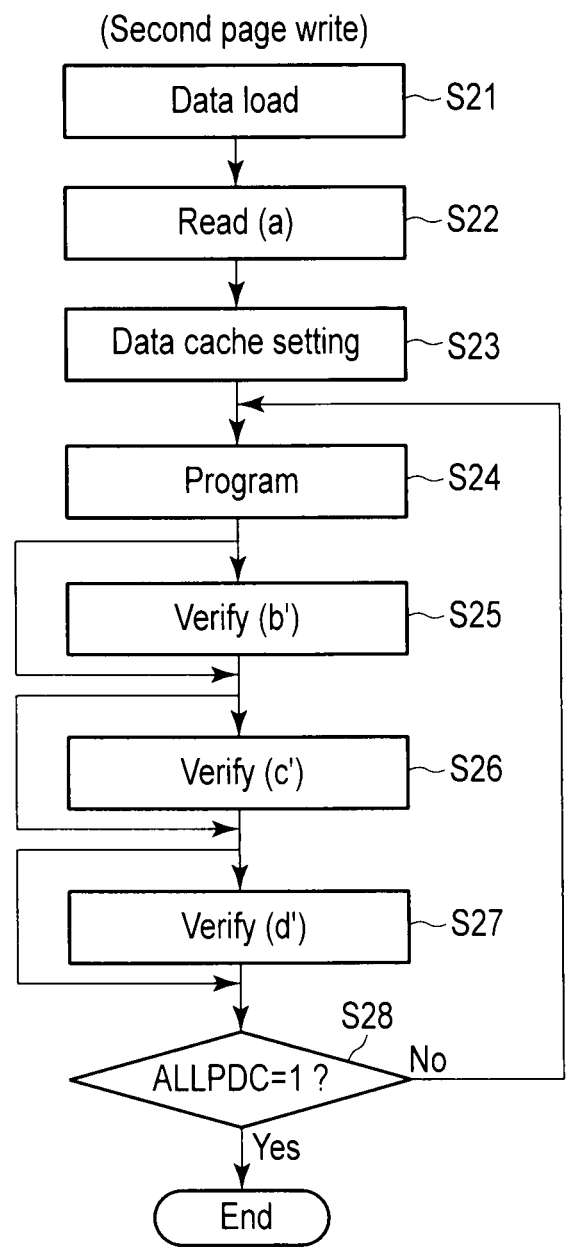
FIG. 12 is a flowchart showing a program operation of a second page.

FIG. 10 shows waveforms of the program operation, FIG. 11 shows the program operation of the first page, and FIG. 12 shows the program operation of the second page.

In the program operation, first an address is designated, and two pages shown in FIG. 2 are selected. In this memory, in the two pages, the program operation can be only carried out in the order other than the order of the first page, and second page. Accordingly, at the beginning, the first page is selected by the address.

Then, write data is input from outside, and the data is stored in the SDC in each of all the data storage circuits 10 (step S11). When a write command is input, data in the SDC in each of all the data storage circuits 10 is transferred to the PDC (step S12). When data "1" (write is not carried out) is input from outside, the node N1*a* of the PDC shifts to the high level and, when data "0" (write is carried out) is input, the node N1*a* shifts to the low level. Hereinafter, the data of the PDC is defined as the potential of the node N1*a* of the data storage circuit 10, and data of the SDC is defined as the potential of the node N2*a* of the data storage circuit 10.

(Program Operation) (S13)

By setting the signal BLC1 of the data storage circuit 10 shown in FIG. 7 to a voltage Vdd+Vth, when data "1" (write is not carried out) is stored in the PDC, the voltage of the bit line becomes Vdd and, when data "0" (write is carried out) is stored therein, the voltage of the bit line becomes Vss. Further, the cells (bit line is unselected) of the unselected page, and connected to the selected word line is not written, and hence a bit line connected to these cells are also set to Vdd.

At this time, when the selected bit line is in the written state (Vss), the unselected bit line is in the unwritten state (Vdd), and hence assuming that the capacitance of a selected bit line, unselected bit line, well, source, and the like is 4 pF, the amount of electric charge of one bit line Q is expressed by Q=C (4 pF)×V (2.5 V). Here, when memory cells of, for example, 8 KB are simultaneously written, Q (8 KB)=8× 1024×8×C (4 pF)×V (2.5 V) is obtained, and a large peak current of the current flowing through the NAND flash memory occurs (during a period, for example, from the time at which Vdd is applied to the unselected bit line, and selected bit line (unwritten) of FIG. 10 to the time before VPASS is applied to the unselected word line).

Further, as shown in FIG. 3, when all the memory cells arranged in the row direction are collectively written, all the bit lines are in the selected state. Particularly, when, in the write data, for example, data "1" and data "0" are alternately arranged, the capacitance between all the bit lines reaches the maximum, and a large peak current occurs.

Here, when Vdd is supplied to the select line SGD of the selected block, write voltage VPGM (20 V) is supplied to the selected word line, and VPASS (10 V) is supplied to the unselected word line, and if the voltage of the bit line is Vss, the voltage of the channel of the cell becomes Vss, the voltage of the word line becomes VPGM, and write is carried out. On the other hand, when the voltage of the bit line is Vdd, the voltage of the channel of the cell is not Vss but is Vdd, and further, the voltage of the channel of the cell is raised about VPGM/2 by coupling, and hence the memory cell is not programmed.

By the write of the first page, the data of the memory cells become data "0", and data "1". After the write of the second page, the data of the memory cells become data items "0", "2", "3", and "4" (S21 to S24). (Program verify read) (S14, S25 to S27)

The memory cells are written from the low level of the threshold voltage, and hence in program verify of the first page, verify is carried out at the level "a'", and in program verify of the second page, verify is carried out at the level "b'", "c'" or "d'". That is, in the program verify, rather than the potential "a", "b", "c" or "d" at the time of the read, the corrected potential "a'", "b'", "c'" or "d'" (assuming that, for example, "a"=0 V, "a'"=0.5 V) is used as the verify potential.

Hereinafter, "'" indicates the verify potential obtained by slightly correcting the read potential. The program verify operation is almost identical to the aforementioned read operation.

First, a predetermined voltage is set on the well, source line, and unselected bit line of the selected cell, and the verify potential "a'", "b'", "c'" or "d'" is applied to the selected word line.

Next, the signal VPRE of the data storage circuit 10 shown in FIG. 7 is set to Vdd (for example, 2.5 V), signal BLPRE is set to Vsg (=Vdd+Vth), and signal BLCLAMP is set to, for example, (0.6 V+Vth), and the bit line is precharged to, for example, 0.6 V. Then, the select line SGS on the source side of the cell is set to Vsg (=Vdd+Vth). The voltage of the well and source line is Vss. Accordingly, when the threshold voltage is higher than "a'", "b'", "c'" or "d'", the cell is turned off, and hence the bit line remains at the high level (for example, 2.2 V) and, when the threshold voltage is lower than "a'", "b'", "c'" or "d'", the cell is turned on, and hence the bit line is discharged to Vss. During the discharge time of the bit line, the signal VPRE is set to Vss, signal BLPRE is set to Vdd, TDC is set to Vss, signal REG is brought to the high level, signal VREG is brought to the high level, and data of the DDC is moved to the TDC. After this, the signal DTG is temporarily set to Vsg (=Vdd+Vth), and data of the PDC is copied into the DDC. Subsequently, the signal BLC1 is brought to the high level, and data of the TDC is moved to the PDC. By this operation, data which has been stored in the PDC, and which indicates write or non-write, moves to the DDC, and data of the DDC moves to the PDC.

Next, the signal BLPRE is temporarily set to Vsg (=Vdd+Vth), and node N3 of the TDC is precharged to Vdd. After this, the signal BLCLAMP is set to, for example, (0.45 V+Vth). When the voltage of the bit line is lower than 0.45 V, the node N3 of the TDC shifts to the low level and, when the voltage of the bit line is higher than 0.45 V, the node N3 remains at the high level. Here, the signal BLC1 is set to Vsg (=Vdd+Vth), and the potential of the TDC is read into the PDC. Then, the signal VREG is set to Vdd, signal REG is set to Vsg (=Vdd+Vth) and, when the DDC is at the high level (non-write), the TDC is forcibly brought to the high level. However, when the DDC is at the low level (write), the value of the TDC does not change. Here, the signal DTG is set to Vsg (=Vdd+Vth), data of the PDC is moved to the DDC, thereafter signal BLC1 is set to Vsg (Vdd+Vth), and potential of the TDC is read into the PDC. Accordingly, when the PDC is originally at the low level (write), and when the threshold voltage of the cell is lower than "a'", "b'", "c'" or "d'", the PDC shifts to the low level (write) again. Further, when the threshold voltage of the cell is higher than "a'", "b'", "c'" or "d'", the PDC shifts to the high level, and is set to non-write at and after the next program. Furthermore, when the PDC is originally at the high level (non-write), the PDC shifts to the high level, and is set to non-write at and after the next program.

Further, at the time of the write of the second page, in the program verify of data "2", when the above operation is carried out, write cells for data "3", and data "4" are set to non-write by the program verify of data "2". Accordingly, in the case of, for example, write of data "3", and data "4", the node N2a of the data storage circuit 10 shown in FIG. 7 is set to the low level and, in the case of write of data "2", the node N2a is set to the high level. In this state, the signal REG is set to Vsg, in the case of non-write, the signal BLC2 is set to Vtr (=0.1 V+Vth) before the operation of forcibly bringing the TDC to the high level is carried out and, in the case of write of the data "3", and data "4", the TDC is forcibly set to the low level in order that the write is not completed in the program verify of data "2".

Further, at the time of the write of the second page, in the program verify of the data "3", when the above operation is carried out, a write cell for data "4" is set to non-write by the program verify of data "3". Accordingly, in the case of, for example, write of data "3", the data of the DDC of the data storage circuit 10 shown in FIG. 7 is set in advance to the low level. During the discharge of the bit line, data of the PDC, and data of the DDC are exchanged with each other, hence before the operation of forcibly bringing the TDC to the high level is carried out, the signal BLC1 is set to Vtr (=0.1 V+Vth), in the case of write of data "4", the TDC is forcibly set to the low level in order that the write is not completed in the program verify of data "4".

When the PDC is at the low level, the write operation is carried out again, and the program operation and verify operation are repeated until the data of the PDC of each of all the data storage circuits 10 is brought to the high level (S15 to S13, S28 to S24).

Further, as shown in FIG. 3, when all the memory cells arranged in the row direction are collectively subjected to program verify, in the same manner as in the case where all the memory cells arranged in the row direction are collectively read, data is read from all the memory cells, and the read data is verified.

(Erase Operation)

The erase operation is carried out in units of blocks indicated by a broken line in FIG. 2, and FIG. 3. After the erase operation, the threshold voltage of the cell becomes identical to the data "0" of the memory cell as shown in FIG. 8C.

First Embodiment

FIG. 13 schematically shows, for example, a Multichip Package (MCP) 70 according to a first embodiment. However, the first embodiment is not limited to the MCP, and can also be applied to a memory card.

In FIG. 13, the MCP 70 includes first, and second chips 71*a* and 71*b*. Each of the first and second chips 71*a* and 71*b* includes a NAND flash memory which is a semiconductor storage device having the aforementioned configuration. In FIG. 13, although an example in which two chips of NAND flash memories are incorporated is shown for the sake of simplification of description, more than two chips may be incorporated.

A controller 72 is electrically connected to the first and second chips 71*a* and 71*b*, supplies chip enable signals CE (A) and CE (B) to the first and second chips 71*a* and 71*b*, further supplies, to the chips 71*a* and 71*b*, a signal R/B indicating ready/busy, aforementioned address latch enable signal ALE, command latch enable signal CLE, write enable signal WE, read enable signal RE, further, address signal ADD, data DT, and the like, and controls write and read of data to and from the first and second chips 71*a* and 71*b*. It should be noted that it is also possible to supply a common chip enable signal CE to the first and second chips 71*a* and 71*b* without supplying chip enable signals CE (A), and CE (B) to the first, and second chips 71*a*, and 71*b*, respectively, and control selection and non-selection of the first and second chips 71*a* and 71*b* by the address.

Further, the controller 72 receives data read from the first and second chips 71*a* and 71*b*, and outputs the data to the outside (for example, the host 9). Furthermore, the controller 72 includes an Error Checking and Correcting (ECC) circuit 75, adds parity data to write data at the time of data write, and carries out error detection and error correction at the time of data read.

Further, a power supply voltage VEXT, and ground voltage VSS are supplied from a power supply generation circuit 73 to the first and second chips 71a and 71b, and controller 72. That is, the power generation circuit 73, first and second chips 71a and 71b, and controller 72 are connected to each other by power supply wirings 81 and 82 by common connection. As a result, the power supply voltage VEXT, and ground voltage VSS are supplied to the first and second chips 71a and 71b, and controller 72 by the power supply wirings 81 and 82.

It should be noted that the power supply generation circuit 73 may be inside the controller 72. Further, the controller 72, and power supply generation circuit 73 may be outside the MCP 70.

Furthermore, the first and second chips 71a, and 71b, and controller 72 include voltage detection circuits 74a, 74b, and 74c, respectively. These voltage detection circuits 74a, 74b, and 74c have the same configuration, detect the potential difference between the power supply voltage VEXT and ground voltage VSS, and detect a drop in the power supply voltage VEXT, and ground of the ground voltage VSS due to currents flowing through the first and second chips 71a and 71b, and controller 72. It should be noted that the voltage detection circuit 74c of the controller 72 can be omitted. From the detection results, the voltage detection circuit 74a can monitor the operating states of the second chip 71b, and controller 72, and voltage detection circuit 74b can monitor the operating states of the first chip 71a, and controller 72. Furthermore, the voltage detection circuit 74c can monitor the operating states of the first and second chips 71a and 71b. Output signals of the voltage detection circuits 74a and 74b are supplied to the control signal and control voltage generation circuits 7 of the first and second chips 71a and 71b including the voltage detection circuits 74a and 74b, respectively, and an output signal of the voltage detection circuit 74c is supplied to, for example, a CPU (not shown) constituting the controller 72.

FIG. 14 shows the voltage detection circuit 74a provided in the first chip 71a. The voltage detection circuit 74a is constituted of voltage dividing resistors R1 and R2, and an operational amplifier OPA. The voltage dividing resistors R1 and R2 are connected in series to each of power supply terminals 76a and 76b in the first chip 71a. The power supply terminal 76a is connected to the power supply wiring 81 through, for example, a metallic wire, or, a metallic bump, and the power supply voltage VEXT is supplied to the power supply terminal 76a. The power supply terminal 76b is connected to the ground wiring 82 through, for example, a metallic wire, and the ground voltage VSS is supplied to the ground terminal 76b. A connection node of the resistors R1 and R2 is connected to one input end of the operational amplifier OPA. A reference voltage Vref is supplied to the other input end of the operational amplifier OPA. The operational amplifier OPA, and a reference voltage generation circuit (not shown) configured to generate the reference voltage Vref operate on the basis of the power supply voltage VEXT or the ground voltage VSS. Further, an output signal of the operational amplifier OPA is supplied to, for example, the control signal and control voltage generation circuit 7.

In the above configuration, a current flowing through, for example, the first chip 71a or the second chip 71b is detected by a voltage converted by the voltage dividing resistors R1 and R2. The detected voltage is compared with the reference voltage Vref in the operational amplifier OPA. As a result of the comparison, when the detected voltage is a voltage (consumption current of the first chip 71a, second chip 71b, and other circuits is small) greater than the reference voltage Vref, the output signal of the operational amplifier OPA is brought to the high level.

On the other hand, when the detected voltage is a voltage (consumption current of the first chip 71a, second chip 71b, and other circuits is large) smaller than the reference voltage Vref, the output signal of the operational amplifier OPA is brought to the low level.

For example, when the first chip 71a is in the program operation state, the consumption current of the first chip 71a reaches the peak. Concomitantly with this, the power supply voltage VEXT lowers, the output signal of the operational amplifier OPA of the voltage detection circuit 74b in the second chip 71b is brought to the low level, and second chip 71b can find out that the consumption current of the first chip 71a is in the peak state. Here, if the second chip 71b also has a large consumption current, i.e., if the second chip 71b shifts to, for example, a program operation, the power supply voltage VEXT further lowers. Accordingly, upon finding out that the consumption current of the first chip 71a is in the peak state, the control signal and control voltage generation circuit 7 of the second chip 71b carries out control in such a manner that the second chip 71b does not shift to an operation flowing a large consumption current, for example, a program operation. Thereby, it is possible to prevent the power supply voltage from further lowering. As shown in FIG. 11 and FIG. 12, the NAND flash memory repeats the program and verify operation. Accordingly, control is carried out in such a manner that peaks of consumption currents in the program operation and verify operation do not occur at the same timing in an overlapping manner.

Figure 15:
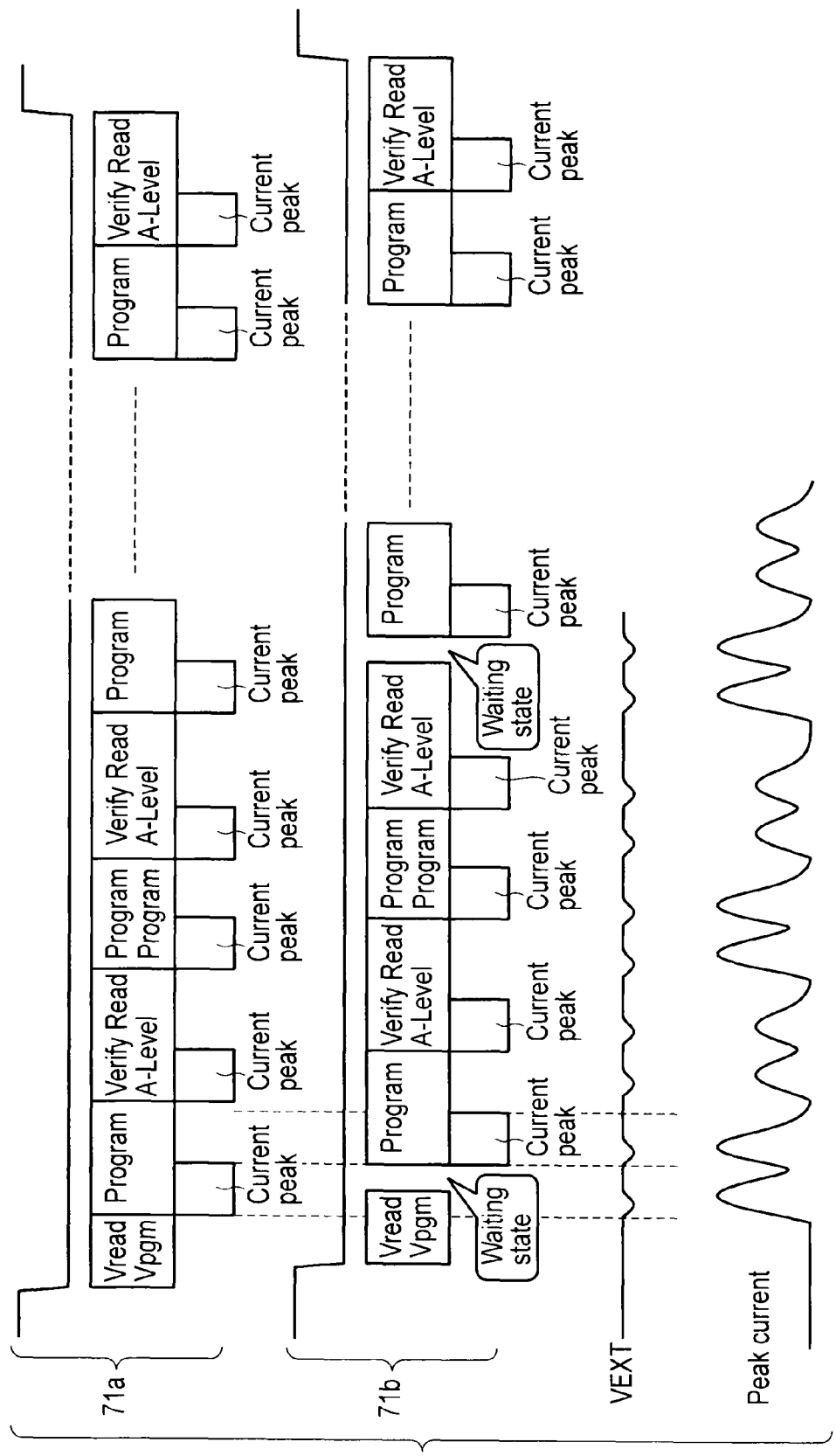
FIG. 15 is a view shown to explain an example of an operation of the first embodiment.

FIG. 15 specifically shows an example of an operation of the MCP 70 configured as described above. Write data is transferred to, for example, the first chip 71a by the controller 72, and thereafter an instruction indicating a write operation is issued. Thereby, as shown in FIG. 15, a program voltage Vpgm and Vread are generated in the first chip 71a, and a program operation is started in the first chip 71a. Thereby, the consumption current of the first chip 71a reaches the peak. As a result of the consumption current of the first chip 71a reaching the peak, the power supply voltage VEXT lowers. The lowering of the power supply voltage VEXT is detected by the voltage detection circuit 74b of the second chip 71b.

On the other hand, in the second chip 71b, write data is transferred to the second chip 71b by the controller 72. After this, an instruction indicating a write operation is issued. In the second chip 71b, a program voltage Vpgm and Vread are generated, and hence a pump circuit included in the control signal and control voltage generation circuit 7 is started up. After this, in the case of a general operation, although a program state sets in, like in the first chip 71a, in the case of the first embodiment, it has been detected by the voltage detection circuit 74b that the power supply voltage VEXT has lowered. Hence the second chip 71b does not shift to the program state, and is brought into a waiting state.

After this, the program operation of the first chip 71a gets near the end, and the current consumption becomes less. In this state, when the output signal of the voltage detection circuit 74b of the second chip 71b shifts to the high level, the second chip 71b starts a program operation, and the consumption current of the second chip 71b reaches the peak.

As described above, it is possible to cause the current peaks of the first and second chips 71a and 71b not to overlap each other by monitoring the power supply voltage VEXT by means of the voltage detection circuits 74a and 74b provided in the first and second chips 71a and 71b.

Further, when the ECC circuit 75 operates in the controller 72, the consumption current increases, and the power supply voltage VEXT lowers. In this case too, it is possible to carry out control in such a manner that the current peaks of the first and second chips 71a and 71b do not overlap the current peak of the controller 72 by monitoring the power supply voltage VEXT by means of the voltage detection circuits 74a and 74b.

According to the first embodiment described above, the voltage detection circuits 74a, 74b, and 74c configured to detect the power supply voltage are provided in the first and second chips 71a, 71b, and controller 72, respectively, and control is carried out in such a manner that when lowering of the power supply voltage is detected by each of the voltage detection circuits 74a, 74b, and 74c, neither the program operation nor the ECC processing is carried out, the chip or chips are brought into the waiting state and, after the power supply voltage has been restored to the predetermined level, the program operation or the ECC processing is executed. Accordingly, it is possible to prevent the first and second chips 71a, 71b, and controller 72 from simultaneously executing operations each requiring a large consumption current. Therefore, it is possible to prevent power-down from occurring due to flowing of a large peak current.

Further, each of the voltage detection circuits 74a, 74b, and 74c provided in the first and second chips 71a, 71b, and controller 72, respectively, operates independently of each other. Further, each the voltage detection circuits 74a, 74b, and 74c controls the operation of corresponding one of the first and second chips 71a, 71b, and controller 72 in which the voltage detection circuits 74a, 74b, and 74c are respectively provided by means of, for example, a delay circuit 77, control signal and control voltage generation circuit 7 or the like. Accordingly, it is not necessary for the first and second chips 71a, 71b, and controller 72 to control the operation timing by delivering/receiving a signal to/from each other. Therefore, it is possible to reduce the number of wirings between the first and second chips 71a, 71b, and controller 72. Here, although the configuration of the two chips or the configuration of the controller circuit and two chips has been described above, it is also possible to constitute the MCP by using a larger number of chips. Furthermore, in the configuration of the plurality of chips, it is also possible to omit voltage detection circuits of part of the chips.

Second Embodiment

Figure 16:
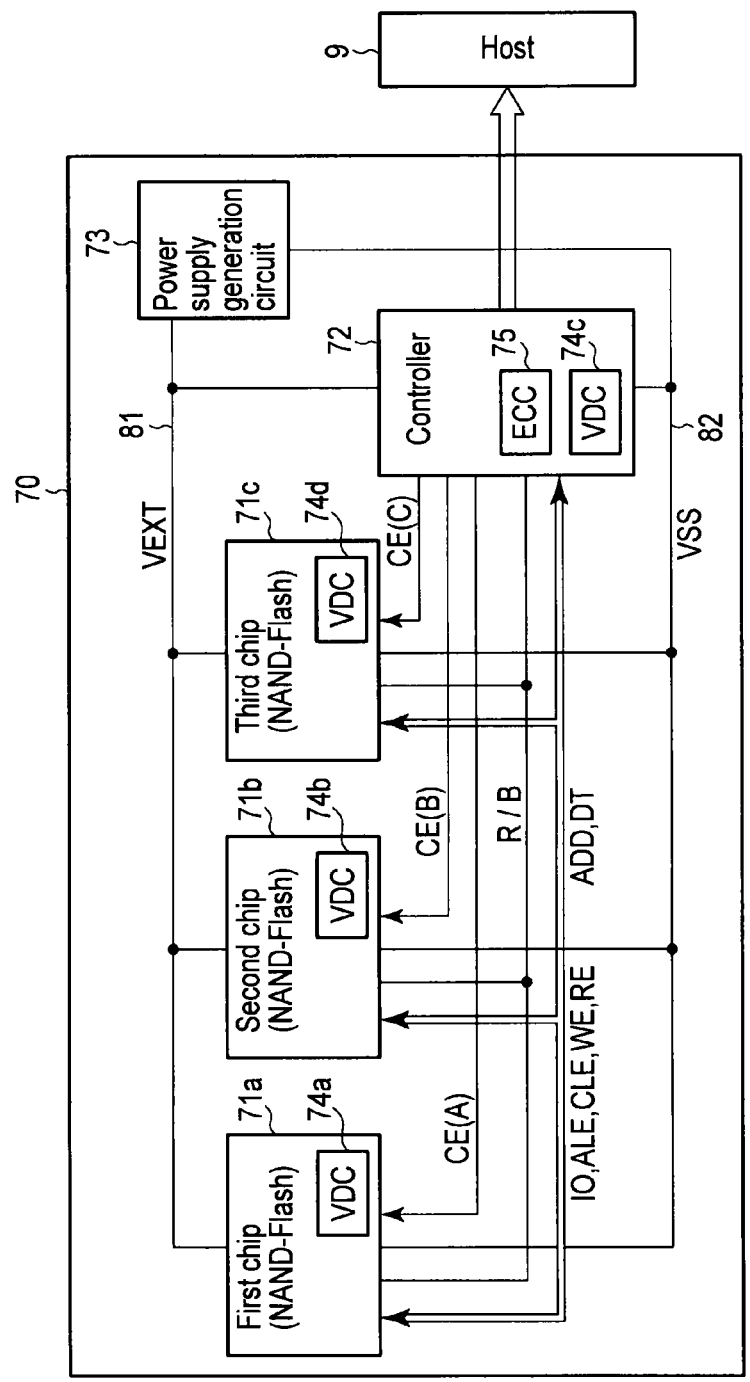
FIG. 16 is a configuration view schematically showing an example of a semiconductor storage system according to a second embodiment.

FIG. 16 shows a second embodiment, parts identical to the first embodiment are denoted by identical reference symbols. In the first embodiment, the MCP in which two chips of the first and second chips 71a and 71b are incorporated has been described. Conversely, in the second embodiment, an MCP in which three or more chips are incorporated is shown.

In FIG. 16, in addition to the first and second chips 71a and 71b, a third chip 71c is provided. The third chip 71c includes a voltage detection circuit 74d configured to detect the power supply voltage. In the case where three or more chips are provided, it is difficult to control chips. When the peak of the consumption current of, for example, the first chip 71a is over, if it is detected in the second and third chips 71b and 71c that the power supply voltage has been restored to the predetermined level. The second and third chips 71b and 71c is controlled not to operate simultaneously to prevent a large peak current occurring.

Thus, in the second embodiment, setting is contrived in such a manner that when it is detected by the voltage detection circuits 74a, 74b, 74c, and 74d that the power supply voltage has been restored to the predetermined level or higher, lengths of time to the points at which the first, second, and third chips 71a, 71b, and 71c start operations each flowing a large consumption current are different from each other. In other words, delays from the point at which it is detected by the voltage detection circuits 74a, 74b, 74c, and 74d that the power supply voltage has been restored to the predetermined level or higher to the points at which the first, second, and third chips 71a, 71b, and 71c start program operations and, according to circumstances, a delay to the point at which the controller 72 resumes an operation flowing a large consumption current such as ECC processing or the like are made different from each other.

Figure 17:
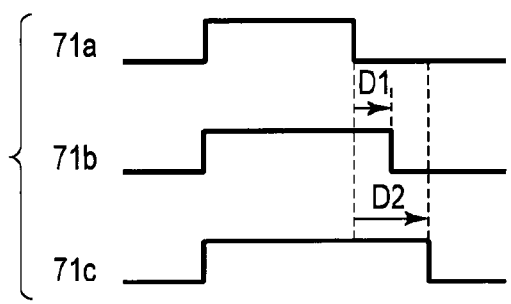
FIG. 17 is a waveform chart showing an example of the operation of FIG. 16.

FIG. 17 shows a delay from the waiting time set for each of the first, second, and third chips 71a, 71b, and 71c to a shift to the next operation. As shown in FIG. 17, in the first chip 71a, the delay is set to, for example, 0 μs. Accordingly, as soon as the waiting state at the high level terminates, the first chip 71a is shifted to the next operation. Further, in the second chip 71b, the delay D1 is set to, for example, 1 μs and, in the third chip 71c, the delay D2 is set to, for example, 2 μs. Accordingly, after the waiting state is over, the second and third chips 71b and 71c are further delayed by the delays D1, and D2, respectively, and are thereafter shifted to the next operations.

It is possible to realize these delays by providing delay circuits in which the above delays are set at the output ends of, for example, the voltage detection circuits 74b and 74d. That is, it is possible to realize the delay by connecting a delay circuit in which the predetermined delay is set between the output end of the operational amplifier OPA shown in FIG. 14, and the control signal and control voltage generation circuit 7.

Furthermore, a delay circuit having a delay different from the above delay may be provided at an output end of the voltage detection circuit 74c provided in the controller 72, and the ECC processing to be carried out by the controller, and requiring a large consumption current, and operations of the first, second, and third chips 71a, 71b, and 71c may be prevented from being simultaneously executed.

According to the second embodiment, in the MCP including three or more chips, lengths of transition time from the point at which the power supply voltage has been restored to the predetermined level to the points at which operations each requiring a large consumption current are started by the first, second, third chips 71a, 71b, 71c, and controller 72 are made different from each other. Accordingly, it is possible to prevent the plurality of chips, and controller from simultaneously executing operations each requiring a large consumption current. Therefore, it is possible to prevent power-down from occurring due to flowing of a large peak current.

It should be noted that in the MCP including two chips too, when, for example, the controller 72 has shifted from the large consumption current state to the small consumption current state, there is the possibility of the first and second chips 71a and 71b simultaneously shifting to the program states. In such a case, by carrying out setting in such a manner that the lengths of time to the starts of operations of the first and second chips 71a and 71b are different from each other, it is possible to prevent the first and second chips 71a and 71b from simultaneously entering the program states.

Third Embodiment

Figure 18:
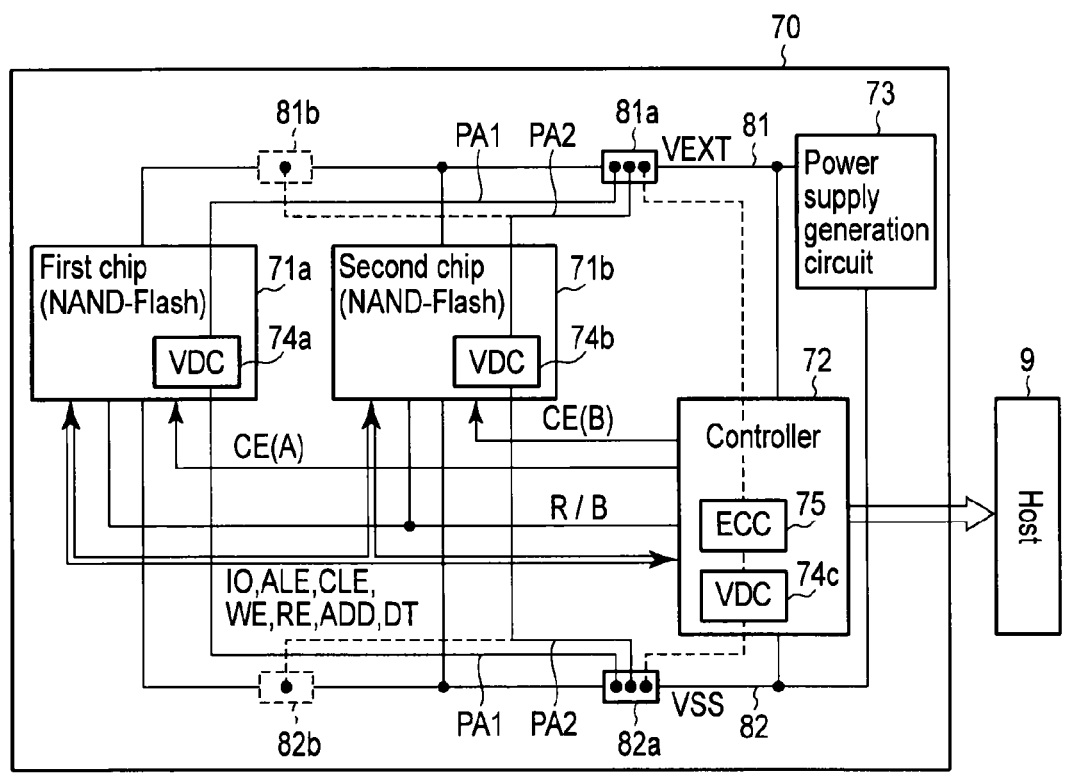
FIG. 18 is a configuration view schematically showing an example of a semiconductor storage system according to a third embodiment.

FIG. 18 shows a third embodiment. The third embodiment is a modification of the first embodiment, and parts identical to FIG. 13 and FIG. 16 are denoted by identical reference symbols. Although the third embodiment shows the case where the embodiment is applied to an MCP, the embodiment can be applied to other devices such as a memory card or the like. Further, in the third embodiment, although the number of chips is two, the number of chips may be three or more.

In the first and second embodiments, each of the voltage detection circuits 74a to 74d is connected to the power supply terminals 76a and 76b of each chip as shown in FIG. 14. In this case, the wiring resistance from the power supply generation circuit 73 (power supply pad from outside the MCP in some cases) to the first and second chips 71a and 71b, and to the controller 72 are different from each other in some cases. The case is, for example, where the wiring is a wiring of a package substrate, and the wiring is routed by using the substrate wiring. Further, each of the voltage detection circuits 74a, 74b, and 74c of the first and second chips 71a, 71b, and controller 72 may not correctly detect the current consumption of the other chip due to the current consumption of first and second chips 71a, 71b, and controller 72 themselves. Hence there is the possibility of the power supply voltage VEXT being unable to be correctly detected.

Thus, in the third embodiment, a voltage detection circuit 74a is connected to terminals different from those to which the other chip is connected. That is, as shown in FIG. 18, between the power supply wiring 81 through which the power supply voltage VEXT is supplied, and ground wiring 82 through which the ground voltage VSS is supplied, e.g., between a second chip 71b and a power supply generation circuit 73, monitor terminals 81a and 82a are provided. Voltage detection circuits 74a, 74b, and 74c of the first and second chips 71a, 71b, and a controller 72 are connected to the monitor terminals 81a and 82a through wirings PA1 and PA2. The wirings PA1 and PA2 are, for example, metallic wires or the like. It should be noted that it is desirable that the electrical resistance values of the wiring PA1 and wiring PA2 be equal to each other. For example, when the same material and the same wiring width are used in the wirings PA1, and PA2, it is desirable that their wiring lengths be identical to each other.

According to the third embodiment, the voltage detection circuits 74a, 74b, and 74c are connected to the monitor terminals 81a, and 82a provided on the power supply wiring 81, and ground wiring 82, respectively. Accordingly, in each of the voltage detection circuits 74a, 74b, and 74c, the influence of the wiring resistance can be reduced. Further, the power is supplied not from the inside of the first, and second chips 71a, 71b, and controller 72, but from the external monitor terminals 81a, and 82a. As a result, it is possible to correctly detect the power supply voltage VEXT without being influenced by the current consumption of the first, and second chips 71a, 71b, and controller 72 themselves.

It should be noted that it is desirable that the arrangement positions of the monitor terminals 81a and 82a be positions, for example, on the wiring substrate at which a change in the power supply voltage is great. For example, it is also possible to arrange monitor terminals for the first chip at positions close to the second chip, and arrange monitor terminals for the second chip at positions close to the first chip.

Further, the grounding end of each of the voltage detection circuits 74a, 74b, and 74c may not be connected to the monitor terminal 82a, but may be connected to the power supply terminal 76b of each of the first, and second chips 71a, 71b, and controller 72.

Furthermore, the arrangement positions of the monitor terminals 81a and 82a are not limited to one position on the power supply wiring 81, and one position on the ground wiring 82 as shown in FIG. 18, and monitor terminals 81a and 82a may be arranged at a plurality of positions on each of the power supply wiring 81, and ground wiring 82, and further, in each of the first and second chips 71a, 71b, and controller 72, the voltage detection circuit 74a, 74b or 74c may be connected to the most suitable monitor terminal to be monitored.

More specifically, as indicated by broken lines in FIG. 18, when, for example, two chips are provided, monitor terminals 81b, and 82b are further provided respectively on the power supply wiring 81, and ground wiring 82 close to the first chip 71a, the voltage detection circuit 74a of the first chip 71a is connected to the monitor terminals 81a, and 82a close to the second chip 71b, and voltage detection circuit 74b of the second chip 71b is connected to the monitor terminals 81b, and 82b close to the first chip 71a, and consumption currents of the first, and second chips are monitored by each other, whereby it is possible for each chip to correctly detect the current consumption of the other chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage system comprising:
a first semiconductor storage device;
a second semiconductor storage device;
a power supply wiring connected to the first semiconductor storage device, and the second semiconductor storage device as a common connection, the power supply wiring configured to supply power to the first semiconductor storage device, and the second semiconductor storage device;
a voltage detection circuit provided in each of the first semiconductor storage device and the second semiconductor storage device, the voltage detection circuit configured to detect a power supply voltage of the power supply wiring; and
a control circuit provided in each of the first semiconductor storage device and the second semiconductor storage device, the control circuit configured to not shift an operation of the first semiconductor storage device or the second semiconductor storage device to the next operation until the power supply voltage is restored when lowering of the power supply voltage is detected by a corresponding one of the voltage detection circuits wherein the control circuits of the first semiconductor storage device and the second semiconductor storage device are controlled to return from a state where the lowering of the power supply voltage is detected, by different delay time after recovery of the power supply voltage is detected.

2. The system according to claim 1, wherein
each of the control circuits of the first semiconductor storage device and the second semiconductor storage device includes a plurality of operating states, and configured to not shift the first semiconductor storage device or the second semiconductor storage device to the next operation when lowering of the power supply voltage is detected.

3. The system according to claim 1, further comprising a controller connected to the first semiconductor storage device and the second semiconductor storage device, wherein the controller includes a voltage detection circuit connected to the power supply wiring, and is configured to detect the power supply voltage.

4. The system according to claim 1, wherein
each of the voltage detection circuits provided in the first semiconductor storage device and the second semiconductor storage device is connected to a monitor terminal provided on the power supply wiring.

5. The system according to claim 4, wherein
the monitor terminal includes first and second monitor terminals,
the first monitor terminal is provided at a position on the power supply wiring close to the first semiconductor storage device, the second monitor terminal is provided at a position on the power supply wiring close to the second semiconductor storage device, the voltage detection circuit of the first semiconductor storage device is connected to the second monitor terminal, and the voltage detection circuit of the second semiconductor storage device is connected to the first monitor terminal.

6. The system according to claim 5, wherein
each of the first and second semiconductor storage devices is constituted of a semiconductor chip.

7. The system according to claim 5, wherein
each of the first and second semiconductor storage devices is constituted of a NAND flash memory.

8. A semiconductor storage system comprising:
a first semiconductor storage device;
a second semiconductor storage device;
a third semiconductor storage device;
power supply wiring connected to the first, second, and third semiconductor storage devices as a common connection, the power supply wiring supplying power to the first, second, and third semiconductor storage devices;
a first voltage detection circuit provided in the first semiconductor storage device, the first voltage detection circuit configured to detect a power supply voltage of the power supply wiring;
a second voltage detection circuit provided in the second semiconductor storage device, the second voltage detection circuit configured to detect the power supply voltage of the power supply wiring;
a third voltage detection circuit provided in the third semiconductor storage device, the third voltage detection circuit configured to detect the power supply voltage of the power supply wiring;
a first control circuit provided in the first semiconductor storage device, the first control circuit configured to immediately shift, when recovery of the power supply voltage is detected by the first voltage detection circuit, the first semiconductor storage device to the next operation;
a second control circuit provided in the second semiconductor storage device, the second control circuit configured to shift, when the recovery of the power supply voltage is detected by the second voltage detection circuit, the second semiconductor storage device to the next operation after an elapse of a first delay time; and
a third control circuit provided in the third semiconductor storage device, the third control circuit configured to shift, when the recovery of the power supply voltage is detected by the third voltage detection circuit, the third semiconductor storage device to the next operation after an elapse of a second delay time longer than the first delay time.

9. The system according to claim 8, further comprising a controller connected to the first, second, and third semiconductor storage devices, wherein
the controller includes a fourth voltage detection circuit connected to the power supply wiring, and configured to detect the power supply voltage.

10. The system according to claim 8, wherein
each of the first, second, and third semiconductor storage devices is constituted of a semiconductor chip.

11. The system according to claim 8, wherein
each of the first, second, and third semiconductor storage devices is constituted of a NAND flash memory.

* * * * *